United States Patent
Goodelle et al.

(10) Patent No.: US 10,185,866 B2
(45) Date of Patent: Jan. 22, 2019

(54) OPTICAL FINGERPRINT SENSOR PACKAGE

(71) Applicant: Synaptics Incorporated, San Jose, CA (US)

(72) Inventors: Jason Goodelle, San Jose, CA (US); Paul Wickboldt, Walnut Creek, CA (US); Young Seen Lee, Newark, CA (US); Chien Lam, San Jose, CA (US); Bob Lee Mackey, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 15/269,901

(22) Filed: Sep. 19, 2016

(65) Prior Publication Data

US 2017/0083745 A1    Mar. 23, 2017

Related U.S. Application Data

(60) Provisional application No. 62/220,712, filed on Sep. 18, 2015.

(51) Int. Cl.
*G06K 9/28* (2006.01)
*G06K 9/00* (2006.01)

(52) U.S. Cl.
CPC ....... *G06K 9/00053* (2013.01); *G06K 9/0004* (2013.01); *H01L 2224/48091* (2013.01); *H01L 2224/48227* (2013.01); *H01L 2224/73265* (2013.01); *H01L 2924/181* (2013.01)

(58) Field of Classification Search
CPC ........................ G06K 9/0004; G06K 9/00053
See application file for complete search history.

(56) References Cited

U.S. PATENT DOCUMENTS

| | | |
|---|---|---|
| 5,726,443 A | 3/1998 | Immega et al. |
| 6,740,870 B1 | 5/2004 | Doudoumopoulos |
| 6,958,261 B2 | 10/2005 | Chow et al. |
| 8,017,445 B1 | 9/2011 | Chang et al. |
| 8,378,502 B2 | 2/2013 | Chow et al. |
| 8,854,179 B2* | 10/2014 | Argudyaev ........ G06K 9/00046 340/5.52 |

(Continued)

FOREIGN PATENT DOCUMENTS

| | | |
|---|---|---|
| WO | WO 2004/092926 A2 | 10/2004 |
| WO | WO 2014/081203 A1 | 5/2014 |
| WO | WO 2016/119492 A1 | 8/2016 |

OTHER PUBLICATIONS

Wikipedia article titled "List of Refractive Indices", downloaded on Apr. 16, 2018, 6 pages total. (Year: 2018).*

(Continued)

*Primary Examiner* — Brian Werner
(74) *Attorney, Agent, or Firm* — Leydig, Voit & Mayer, Ltd.

(57) ABSTRACT

Disclosed are optical sensors, optical fingerprint sensor packages, and methods for forming same. An optical sensor comprises: a substrate; an image sensor disposed over the substrate; a light source disposed over the substrate; a light guide disposed over the image sensor; and, an encapsulant disposed over the light source, wherein the encapsulant is coupled to the light guide and comprises a surface positioned to reflect light emitted from the light source and direct the reflected light into the light guide.

22 Claims, 21 Drawing Sheets

(56) References Cited

U.S. PATENT DOCUMENTS

| | | | |
|---|---|---|---|
| 9,136,258 | B1 | 9/2015 | Wang et al. |
| 9,201,524 | B2 | 12/2015 | Campbell et al. |
| 2001/0050765 | A1* | 12/2001 | Antonelli ........... G06K 9/00026 |
| | | | 356/71 |
| 2003/0103686 | A1 | 6/2003 | Ogura |
| 2005/0157911 | A1 | 7/2005 | Iseri et al. |
| 2006/0051891 | A1 | 3/2006 | Bolken et al. |
| 2011/0298715 | A1 | 12/2011 | Hung et al. |
| 2012/0321149 | A1 | 12/2012 | Carver et al. |
| 2015/0347813 | A1 | 12/2015 | Tsen |
| 2016/0132712 | A1 | 5/2016 | Yang et al. |
| 2016/0140380 | A1* | 5/2016 | Carver ................. G06K 9/0004 |
| | | | 382/124 |
| 2016/0224816 | A1 | 8/2016 | Smith et al. |
| 2016/0247010 | A1 | 8/2016 | Huang et al. |
| 2016/0328595 | A1 | 11/2016 | Sun et al. |

OTHER PUBLICATIONS

U.S. Appl. No. 62/156,758, filed May 4, 2015.
U.S. Appl. No. 62/078,427, filed Nov. 12, 2014.
International Search Report issued in PCT/US2016/052553, dated Nov. 17, 2016 (3 pages).
Written Opinion of the International Searching Authority issued in PCT/US2016/052553, dated Nov. 17, 2016 (8 pages).
International Preliminary Report on Patentability issued in PCT/US2016/052553 dated Mar. 20, 2018 (9 pages).

* cited by examiner

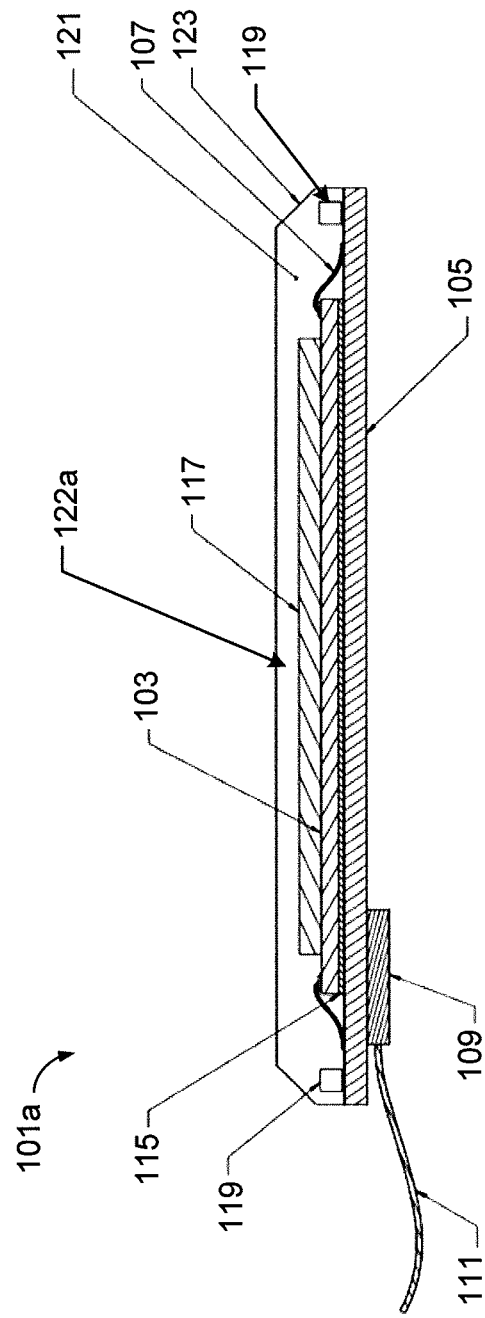

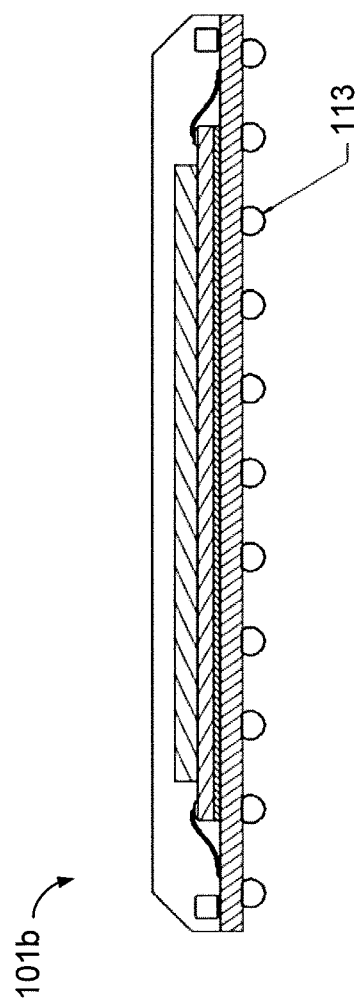

OPTICAL FINGERPRINT SENSOR PACKAGE

CROSS-REFERENCE TO RELATED APPLICATIONS

This application claims priority to U.S. provisional patent application No. 62/220,712, filed on Sep. 18, 2015, the entire contents of which is hereby incorporated by reference in its entirety.

FIELD

The present disclosure generally relates to optical sensors and, more specifically, to packaging for optical fingerprint sensors.

SUMMARY

In one aspect, an optical sensor comprises: a substrate; an image sensor disposed over the substrate; a light source disposed over the substrate; a light guide disposed over the image sensor; and, an encapsulant disposed over the light source, wherein the encapsulant is coupled to the light guide and comprises a surface positioned to reflect light emitted from the light source and direct the reflected light into the light guide.

In another aspect, an optical fingerprint sensor package comprises: a package substrate; an image sensor die disposed over the package substrate, wherein the image sensor die comprises a photodetector array and is electrically connected to the package substrate; a light filter disposed over the image sensor die; a light-emitting diode (LED) light source disposed over the package substrate; a light guide disposed over the light filter; an air gap disposed over the light filter between the light guide and the light filter; and, an optically clear molding compound disposed over the LED light source, wherein the optically clear molding compound is coupled to the light guide and comprises a surface positioned to reflect light emitted from the light source and direct the reflected light into the light guide.

In another aspect, an optical fingerprint sensor package comprises: a package substrate; an image sensor die disposed over the package substrate, wherein the image sensor die comprises a photodetector array and is electrically connected to the package substrate; a light-emitting diode (LED) light source disposed over the package substrate; and, an optically clear molding compound disposed over the LED light source, wherein the optically clear molding compound is coupled to the light guide and comprises a surface positioned to reflect light emitted from the light source and direct the reflected light to a sensing area above the image sensor die.

In another aspect, a method of forming an optical sensor package comprises: attaching an image sensor die to a substrate; electrically connecting the image sensor die to the substrate; mounting a light-emitting diode (LED) to the substrate; and, overmolding the LED with an optically clear molding compound, wherein a light guide is disposed over the image sensor die, and wherein the optically clear molding compound comprises a surface positioned to reflect light emitted from the LED and direct the reflected light into the light guide.

BACKGROUND

Input devices, including proximity sensor devices (such as touchpad and touch screen sensor devices) and biometric sensor devices (such as fingerprint sensor and eye scanner devices), are widely used in a variety of electronic systems. A sensor device typically includes a sensing region, often demarked by a surface, in which the sensor device detects one or more input objects to determine positional information and/or image the input object. Sensor devices may be used to provide interfaces for the electronic system. For example, sensor devices are often used as input devices for larger computing systems (such as notebook and desktop computers) and smaller computing systems (such as cellular phones and wearable computing devices) to provide interfaces for control inputs and user authentication.

Input devices utilizing optical sensors sometimes incorporate active illumination of the input object (e.g., a finger). These typically require additional auxiliary light sources that add to the cost and complexity of the device design and assembly.

BRIEF DESCRIPTION OF DRAWINGS

The exemplary embodiments of the present disclosure will hereinafter be described in conjunction with the appended drawings, where like designations denote like elements.

FIGS. 1A-1C depict wire bonded optical sensor packages.

DETAILED DESCRIPTION

The following detailed description is merely exemplary in nature and is not intended to limit the embodiments or the application and uses of the embodiments. Furthermore, there is no intention to be bound by any expressed or implied theory presented in the preceding technical field, background, summary, or the following detailed description.

Figure 1B:
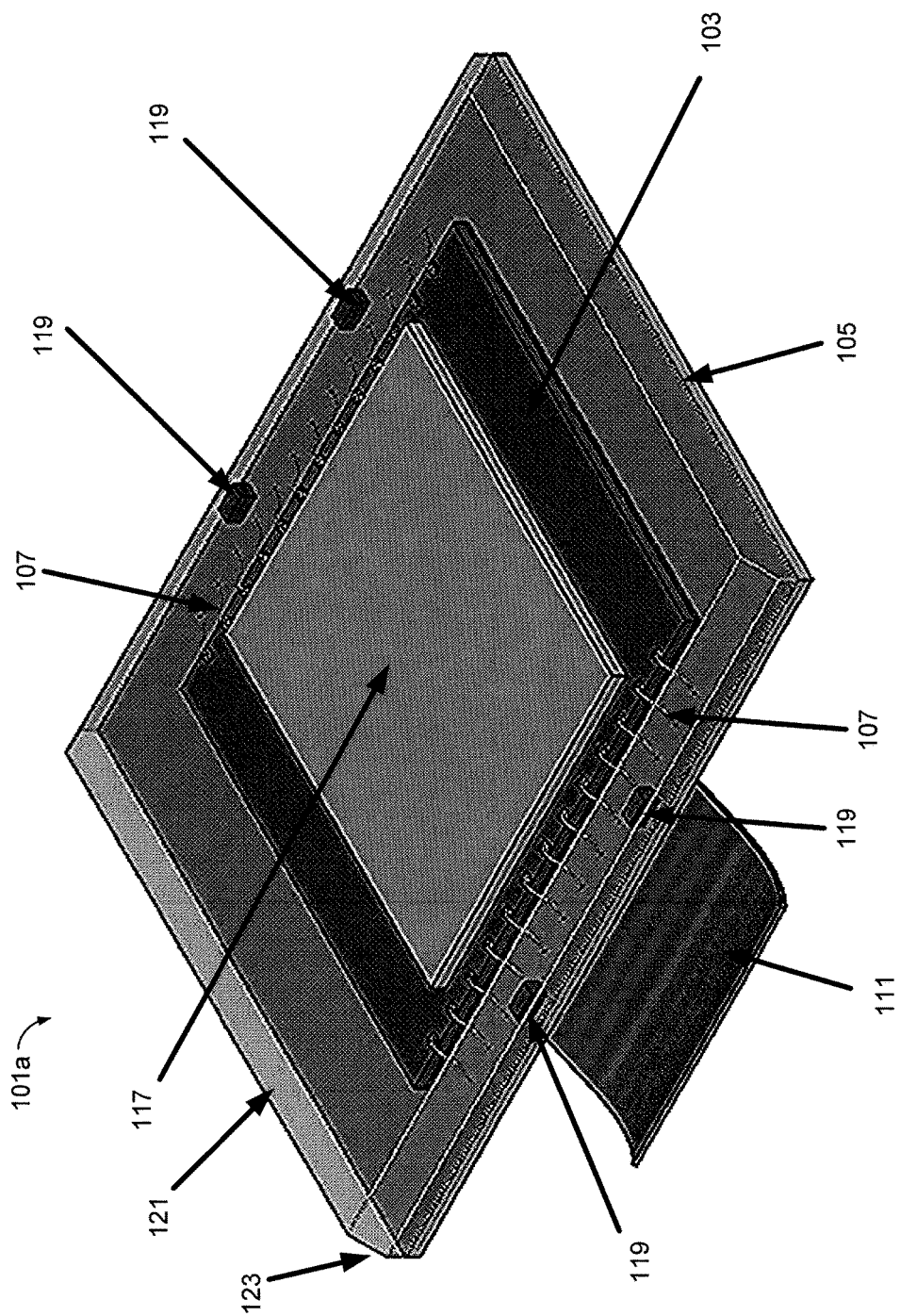

Turning now to the figures, FIGS. 1A-1B depict an optical fingerprint sensor package 101a in which a front side illuminated (FSI) image sensor die 103 is connected to a substrate 105 using wire bonds 107. FIG. 1A depicts the optical fingerprint sensor package 101a in cross-section view, while FIG. 1B depicts the optical fingerprint sensor package 101a in isometric view.

In the optical fingerprint sensor package 101a, the image sensor die 103 is positioned over the substrate 105 and attached to the substrate 105 using a die attach layer 115. The die attach layer 115 attaches or bonds the image sensor die 103 to the substrate 105 and may include any suitable die attach material, with adhesives such as epoxy or solder being some examples. The image sensor die 103 is electrically connected to the substrate using wire bonds 107 connected to a peripheral portion of the die. In this example, the image sensor die 103 is a FSI image sensor and the wire bonds 107 are bonded to the active side of the die, which also corresponds to an upper surface or upper side of the die in this orientation. The substrate 105 is any suitable electronic package or integrated circuit (IC) package substrate that provides routing or electrical interconnections for connecting the image sensor die 103 to external devices. The image sensor die 105 includes a plurality of light sensitive elements or a photodetector array for optically capturing a fingerprint image from a sensing region over the image sensor die 103 and optical fingerprint sensor package 101a. In FIG. 1A, the sensing region or sensing side corresponds to the upper side of the package and the upper side of the figure.

A light filter 117 or optical element layer is positioned over the image sensor die 103. The light filter 117 conditions or filters the light reaching the photodetector array of the image sensor die 103 to capture a suitable fingerprint image. The light filter 117 may include a collimator filter that filters incident light so that only rays of light that are within an acceptance angle from normal to the collimator filter plane are transmitted or allowed to pass through the collimator filter, while the collimator filter rejects or blocks rays of light that are outside of the acceptance angle. That is, the collimator filter transmits incident light whose rays of light are parallel to the normal of the collimator filter plane (which is also the normal of the image sensor plane), and the collimator filter also transmits a set of rays that are not perfectly parallel but within a given acceptance angle relative to that normal, but the collimator filter blocks a set of rays that are outside of the given acceptance angle relative to normal. The acceptance angle of the collimator filter may vary depending on the desired image resolution, sensing distance, or other parameters. In alternate implementations, the light filter 117 may include other optical elements for acting on the light reaching the image sensor die 103, such as lenses, pinholes, diffractive elements (e.g., zone plates), or optical fiber bundles. The light filter 117 may optionally be fabricated or manufactured using wafer level processing in connection with the wafer processing of the image sensor dies.

The optical fingerprint sensor package 101a also includes a plurality of LED light sources 119 positioned over the substrate 105 in areas outside of the sensor die area and next to the image sensor die 103. Multiple LED light sources 119 are included on opposing sides of the image sensor die 103. In this example, four LED light sources 119 are included, two on one side of the image sensor die 103 and two on the opposite side of the image sensor die 103. The LED light sources 119 include upward firing LEDs that may be soldered or otherwise attached to the substrate 105. An optically clear epoxy molding compound (OCEMC) 121 is positioned over the LED light sources 119 and provides an encapsulant over the LED light sources 119. The OCEMC 121 also extends over the sensing area (corresponding to the active area of the image sensor die 103) forming a light guide 122a in this sensing area that is integral with and optically coupled to the portion of OCEMC that is positioned over the LED light sources 119. The light guide 122a can be used to direct light emitted from the LED light sources 119 towards a sensing region or an input object, such as a finger, that is positioned over the sensing area. The OCEMC 121 includes an internally reflecting surface 123 in an area over or proximate to the LED light source 119 that is positioned to reflect light emitted from the LED light source 119 and direct the reflected light into the light guide 122a at an angle that creates total internal reflection in the light guide 122a.

The OCEMC 121 over the LED light sources 119 is transparent to the light emitted by the LEDs to a sufficient degree to allow the light from the LEDs to pass therethrough and reach the sensing region above the image sensor die 103. In this example, the OCEMC also surrounds the image sensor die 103 and encapsulates the image sensor die 103 as well, including the wire bonds 107. The OCEMC 121 has an index of refraction greater than that of air (or another medium outside the OCEMC 121 surface 123 boundary, depending on the construction or operating environment), which may vary depending on the particular choice of material. An example refractive index for the OCEMC is about 1.5, but this may vary in different implementations depending on the choice of material used. The refractive index of the OCEMC 121 relative to the surrounding environment (e.g., air) allows the light emitted by the LED light sources 119 to reflect at the surface 123 using Fresnel reflection. This may be achieved by positioning the reflecting surface 123 relative to the LED light source 119 such that a portion of the light emitted by the LED is incident at this surface 123 at the critical angle determined by this interface and directed to the desired sensing area. In optical fingerprint sensor package 101a, this is achieved by having a tilted or beveled surface with a flat geometry that is angled relative to the LEDs to reflect light incident at the surface 123 in this manner and direct this light into the light guide 122a. It will be appreciated that the particular angle or angles to achieve this effect may vary in different implementations.

The substrate 105 provides an interposer with electrical interconnections, routing, or wiring for electrically connecting the image sensor die 103 and LED light sources 119 to other components. The optical fingerprint sensor package 101a of FIGS. 1A-1B includes a connector 109 and a flex tail 111 (i.e., flexible connector) that are electrically connected to the substrate 105. FIG. 1C depicts a cross-section view of optical fingerprint sensor package 101b, which is similar to the optical fingerprint sensor package 101a shown in FIGS. 1A-1B, except in this implementation ball grid array (BGA) balls 113 are electrically connected to the substrate 105. The flexible connector 111 or BGA balls 113 can be used to connect the sensor package to external devices or circuitry (not pictured), and it will be appreciated that other interconnects may be suitable as well. The optical modules in FIGS. 1A-1C could include other components besides the CMOS (complementary metal-oxide-semiconductor) image sensor and LEDs, such as passive components, other control chips, and the like. The finished module depends on exact product or application parameters. However, it is possible for all components to be included within the same package (either within or outside the OCEMC region) in various implementations.

Figure 2A:
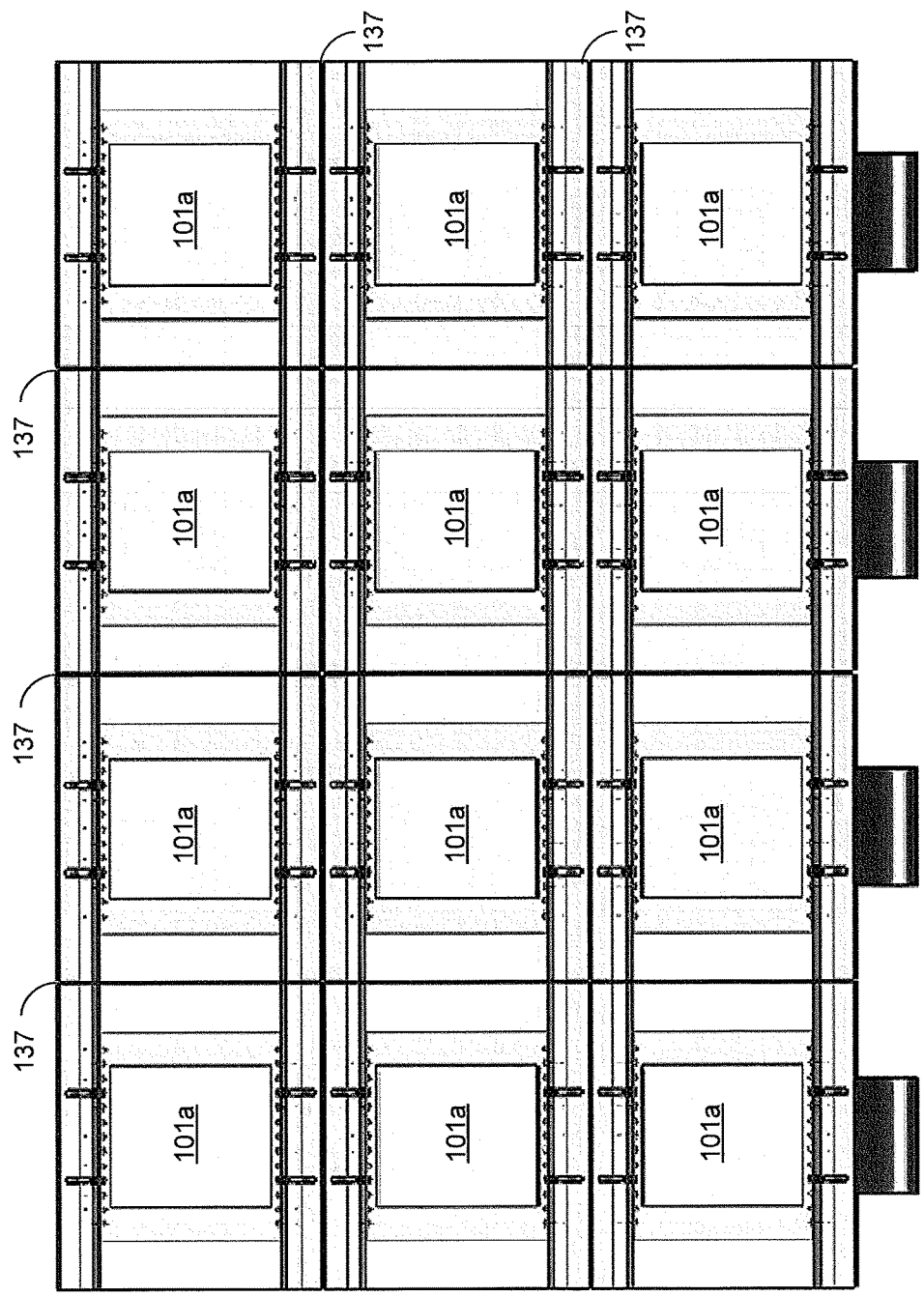
FIGS. 2A-2B depict a plurality of optical sensor packages in a panel or array format.
Figure 2B:
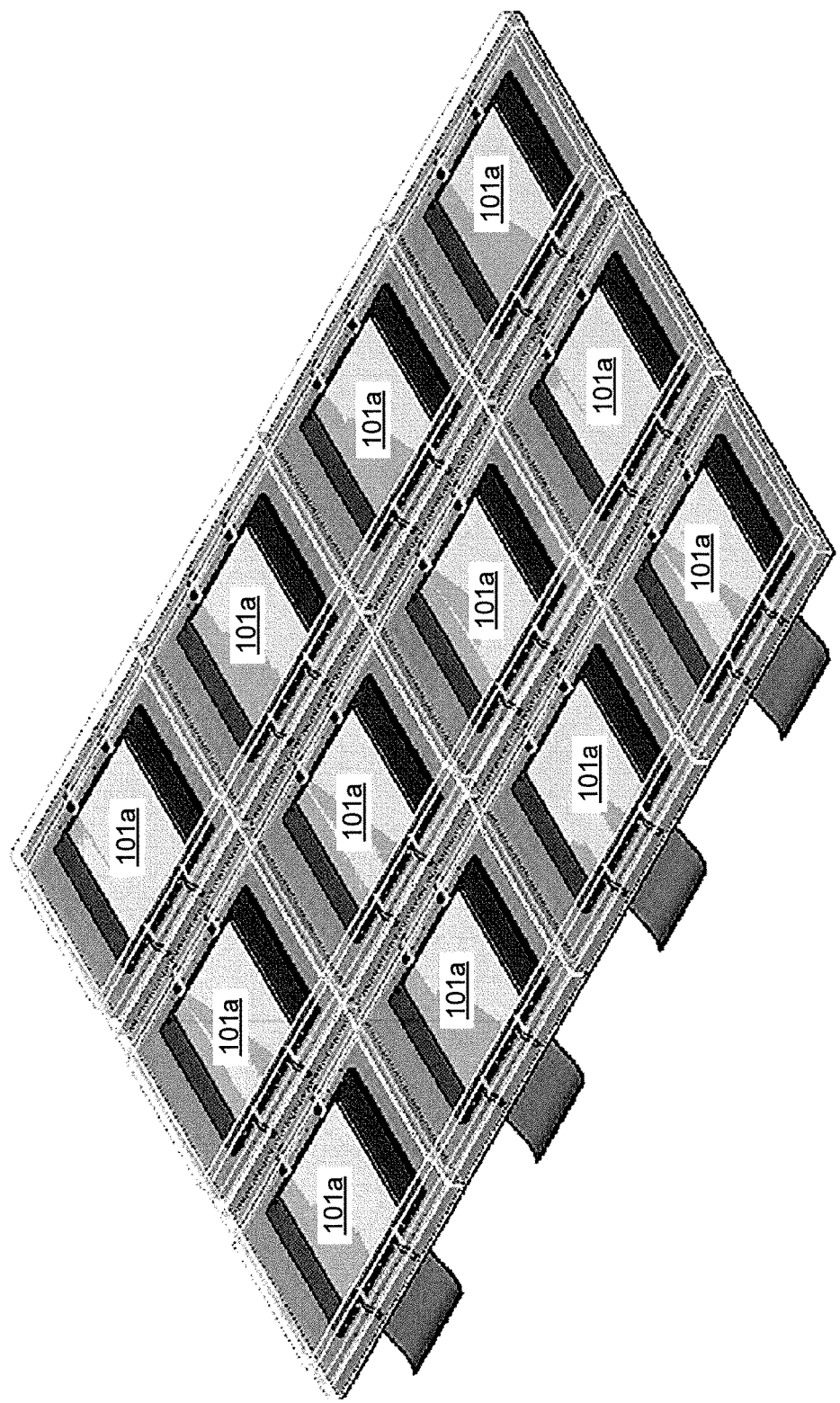

FIGS. 2A-2B depict a panel or strip level processing format that can be applied to the optical FPS package assembly flow for the optical fingerprint sensor packages 101a from FIGS. 1A-1B. FIG. 2A depicts a top view or plan view of multiple optical fingerprint sensor packages 101a in a panel or strip before singulation of the individual sensor packages, while FIG. 2B depicts the optical fingerprint sensor packages 101*a* in isometric view. By utilizing panel or strip level processing, lower cost and smaller form factor devices can be realized. Fabricating the optical FPS packages can be completed using standard panel level (or strip level) processes using a continuous molded section through all the individual optical fingerprint sensor packages 101*a*, and the individual optical fingerprint sensor packages 101*a* can be subsequently singulated using a variety of techniques such as mechanical blade saw or laser dicing along singulation lines 137, as an example. While the example in FIGS. 2A-2B uses the optical fingerprint sensor package 101*a* from FIGS. 1A-1B, the panel, strip, or array processing format can be applied to other packages described herein. Board level attachment of the optical FPS package can be realized by implementing standard 2nd level interconnects such as flex circuits and BGA balls for example.

Figure 3:
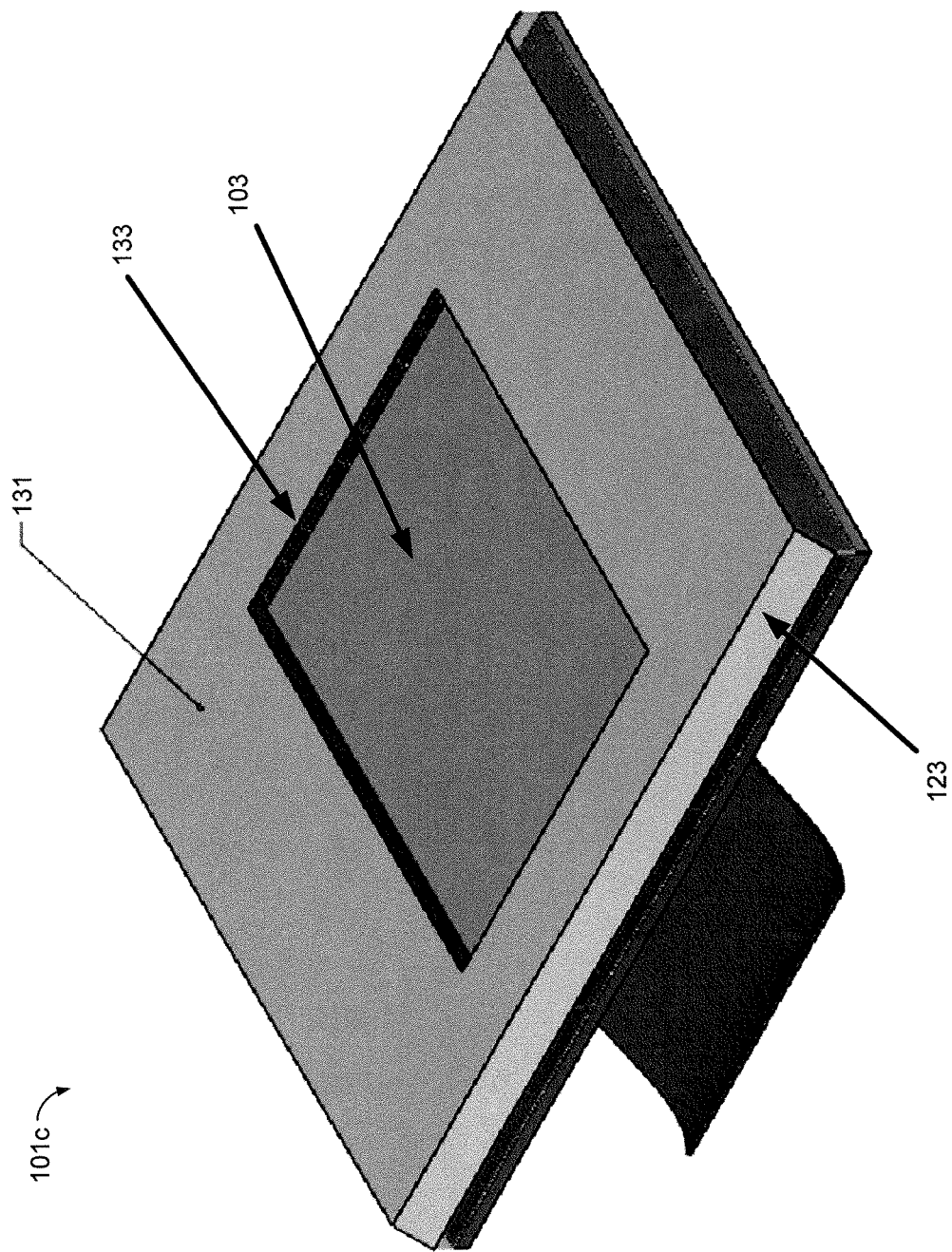
FIG. 3 depicts an optical sensor package having a reflective layer.

FIG. 3 depicts another optical fingerprint sensor package 101*c*. The optical fingerprint sensor package 101*c* includes a reflective layer 131 positioned over the reflection surface 123 to provide or enhance reflection of light emitted by the LEDs. The reflective layer 131 includes a window 133 over an active area or sensing area of the image sensor die 103 to permit light sensed from a finger or other object to reach the detector elements of the image sensor die 103. The reflective layer 131 may be formed by coating a metallic film on an outer surface of the OCEMC 121, particularly on the angled surface 123, while leaving the sensing area exposed or free of the reflective metallic film. This coating can be applied using masking techniques and commercially available metal sputtering or plating. Aluminum (Al), silver (Ag), gold (Au), and Nickel (Ni) films are examples of materials that can be used in the reflective layer, and they can be applied after panel molding, e.g., such as that shown in FIGS. 2A-2B.

Figure 4A:
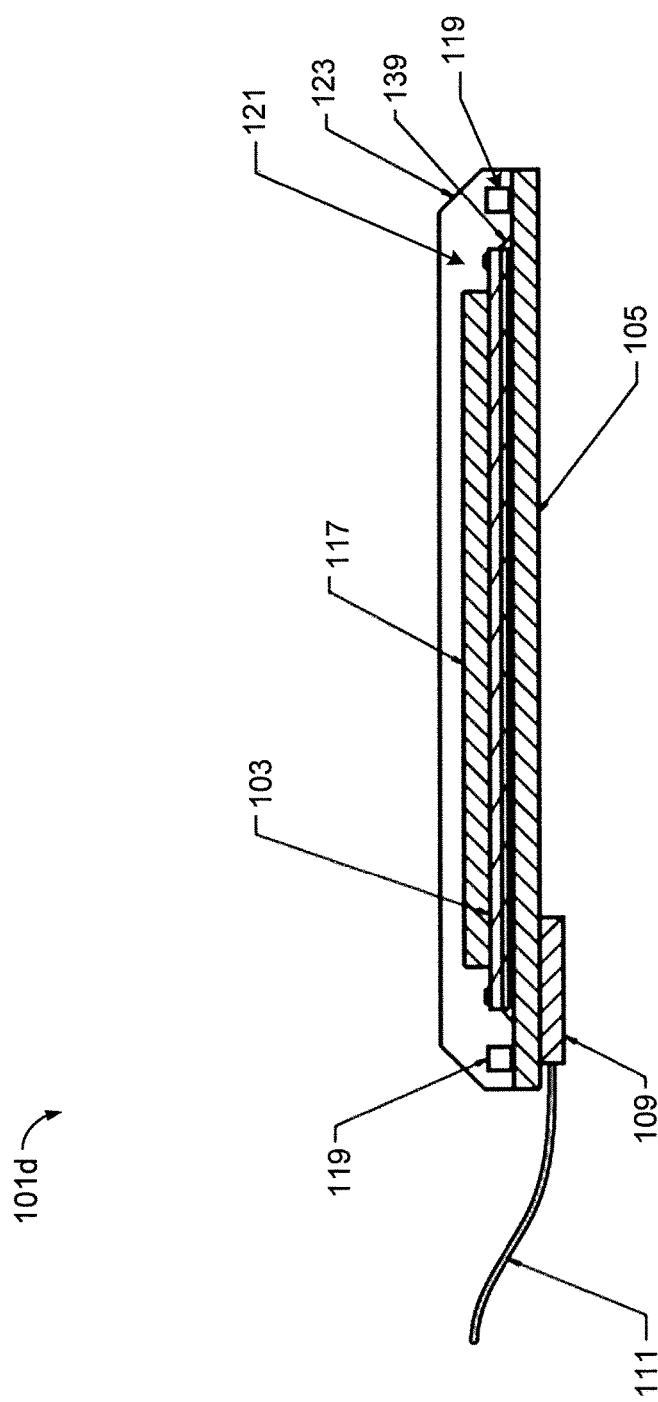
FIGS. 4A-4B depict a flip chip attached optical sensor package.
Figure 4B:
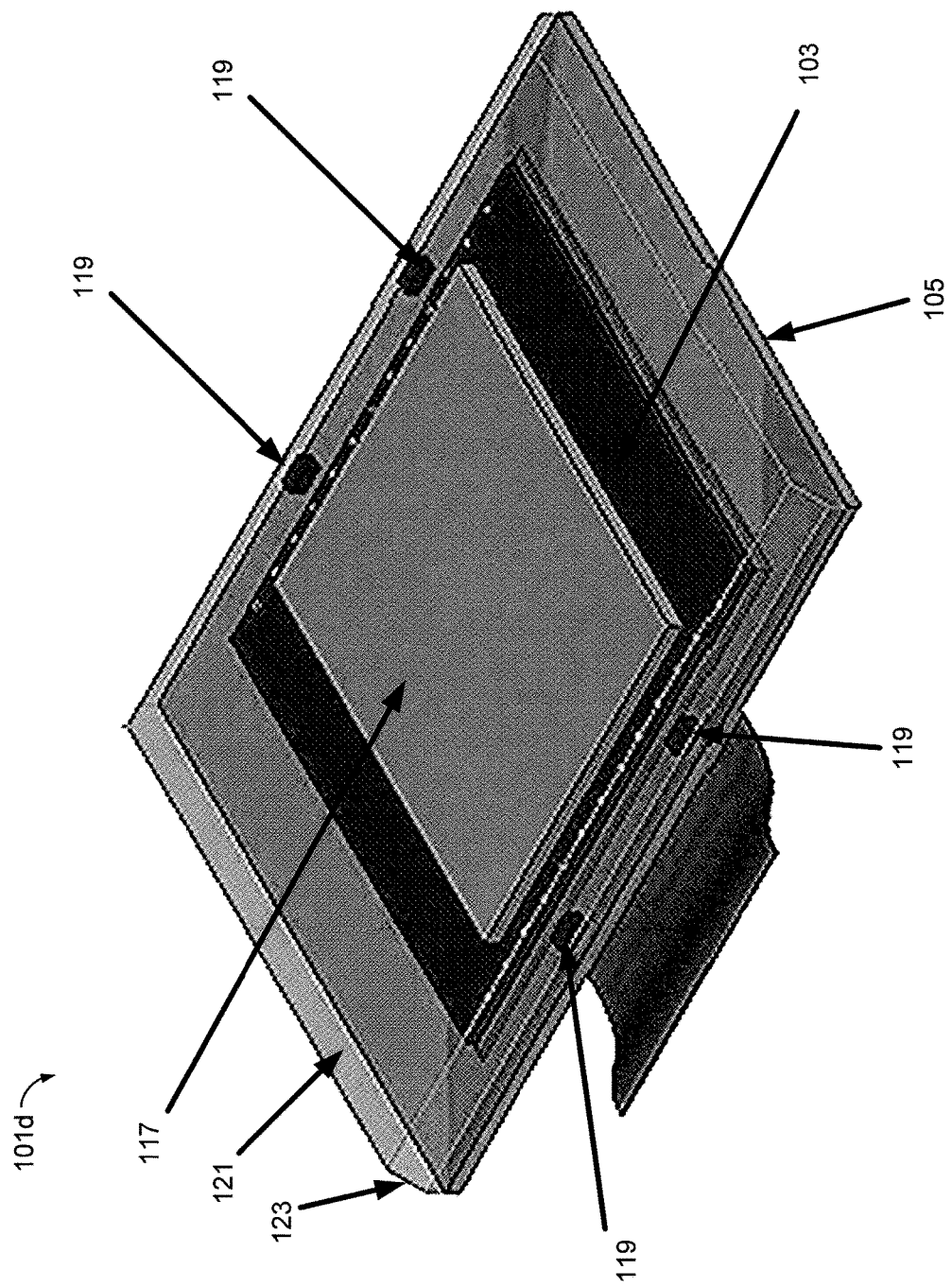

FIGS. 4A-4B depict another optical fingerprint sensor package 101*d*. While FIGS. 1A-1C depict a wire bonded solution, FIGS. 4A-4B shows the use of a complementary metal-oxide-semiconductor (CMOS) image sensor die 103 (in this case a back side illumination type) that utilizes through silicon via (TSV) technology plus flip chip attach technology (e.g, Cu pillar bumps, solder bumps, etc.) to attach and electrically connect the image sensor die 103 to the substrate 105. The flip chip solution that can help reduce the form factor (coupled with panel or strip level assembly) by eliminating the need for wire bonds around the periphery of the die to make electrical connections. It is estimated that this can save ~300 to 500 um in package size in x,y dimensions, depending on the flip chip process. Underfill 139 is used in this example, as is typically used along with a flip chip die attach process, but the underfill may be eliminated by the use of an overmold material with appropriate material properties (typically known as molded underfill or "MUF").

Figure 5:
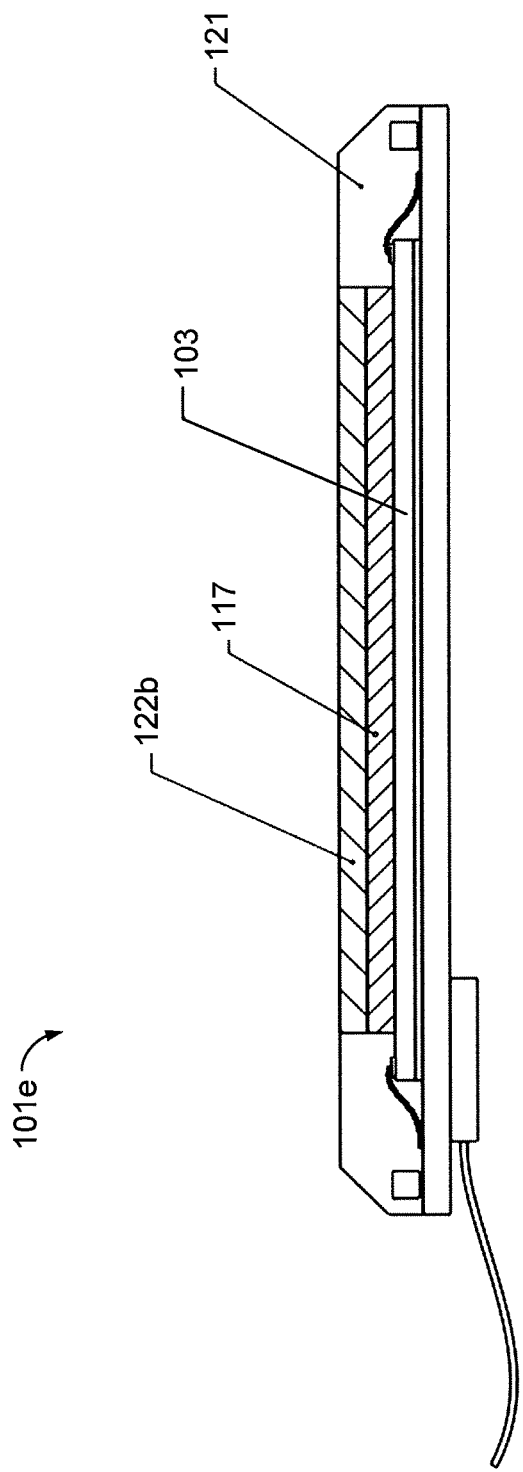
FIG. 5 depicts an optical sensor package having an encapsulant over an LED (light-emitting diode) light source, and a light guide separate from the encapsulant.

FIG. 5 depicts another optical sensor package 101*e*. The optical sensor package 101*e* includes a light guide 122*b* that is separate from the OCEMC 121, and that is positioned over the image sensor die 103 and light filter 117. The light guide 122*b* includes an optically clear layer that is optically coupled to the OCEMC 121. In this case, the light guide 122*b* is optically coupled to the separate OCEMC layer 121 by positioning these two layers in contact with each other. The light guide 122*b* layer may be wafer level applied on top of the light filter layer. This light guide layer may also be applied by laminating to the surface of the wafer. The light guide 122*b* layer may be applied prior to packaging by using wafer level applied (or laminated) optically clear illumination layer(s) formed directly on top of the light filter 117. Improved performance may be realized by reducing trapped open spaces and providing better light guiding performance. This may be a more costly approach in some instances, but may allow for more flexibility in fabrication modes (for example to laminate a layer that contains microstructures for a higher performance light guide illumination layer).

Figure 6:
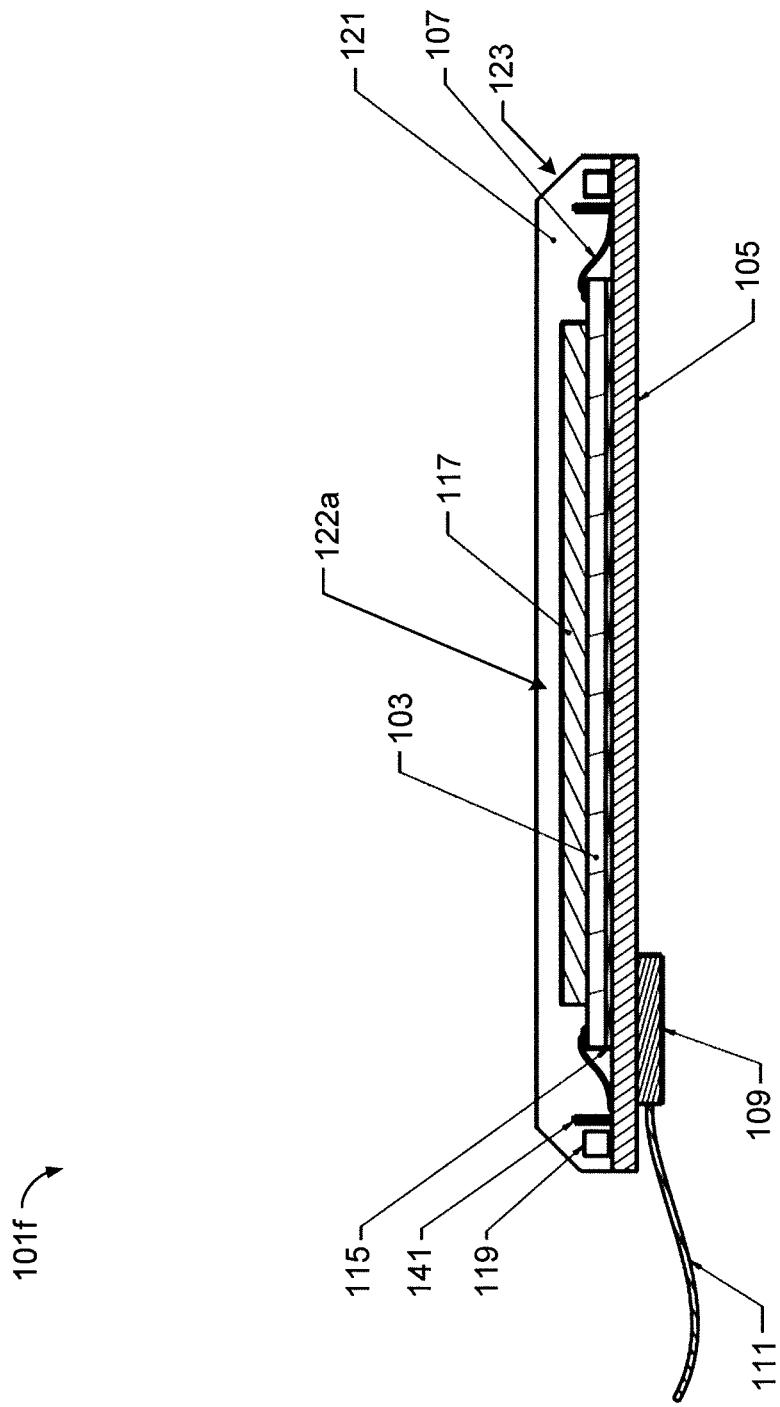
FIG. 6 depicts an optical sensor package having reflector structures attached to a substrate.

FIG. 6 depicts another optical sensor package 101*f*. The optical sensor package 101*f* includes reflector structures that can be strategically placed on the substrate 105 prior to overmolding or encapsulation to enhance the amount light entering the light guide 122*a*. In this example, the reflector structures are positioned between the LED light source 119 and the image sensor die 103. The LED light sources 119 may emit light at a wide angle that disperses in multiple directions, including straight up, towards the outer portion of the package, and towards the inner portion of the package. The reflector structures 141 are positioned to reflect the light that is emitted towards the inner portion of the package back towards the reflecting surface 123, where it can be further reflected towards the light guide 122*a*. Multiple reflection structures are included in this example, but more or fewer may be used. For example, a single reflection structure 141 may be included if only a single LED is included in the package. These structures can be overmolded with OCEMC during the same process used to encapsulate the other structures.

Figure 7:
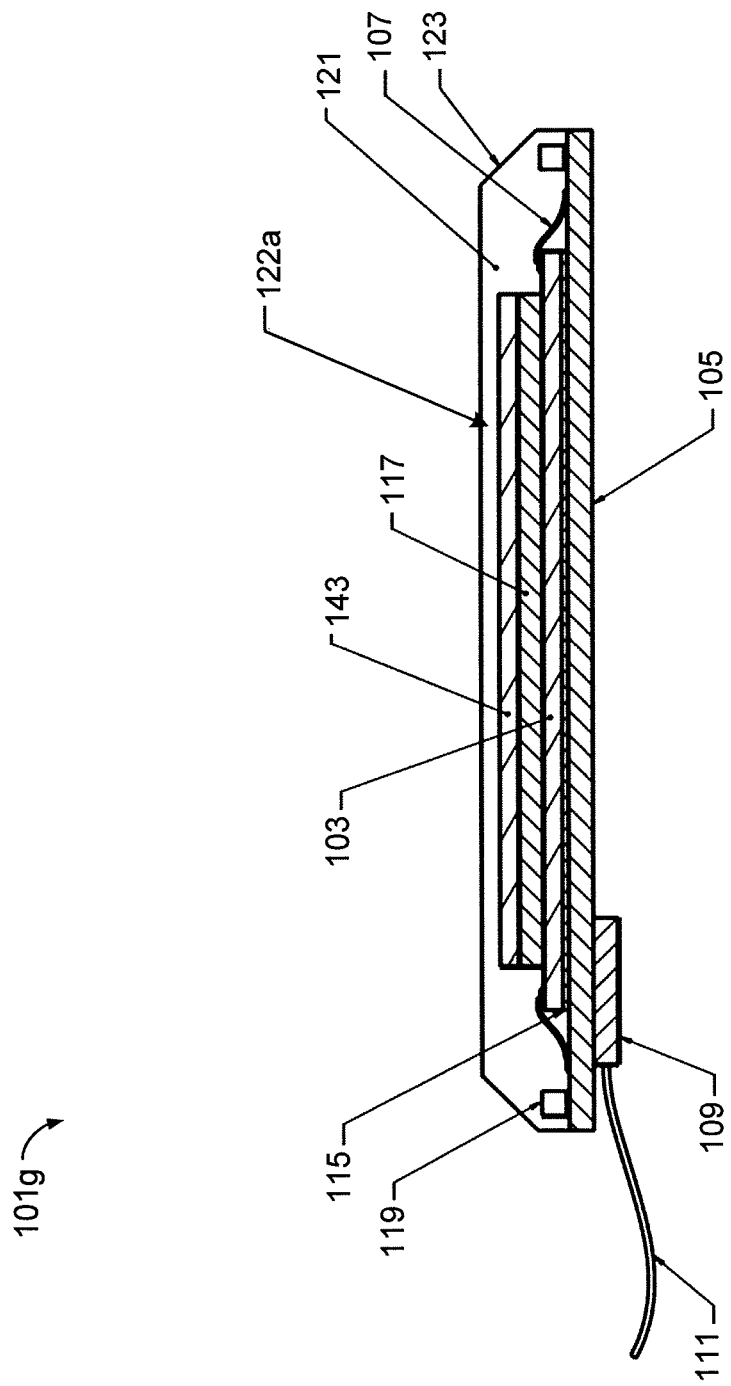
FIG. 7 depicts an optical sensor package having an air gap above an image sensor die and below an optically clear cover or light guide.

FIG. 7 depicts another optical sensor package 101*g*. The optical sensor package 101*g* includes an air gap 143. The air gap 143 is below the light guide 122*a* and above the light filter 117, and the air gap 143 may be molded in, in this example. In alternative implementations, the air gap 143 may be replaced with a low refractive index material having a lower refractive index than the light guide 122*a*.

Figure 8A:
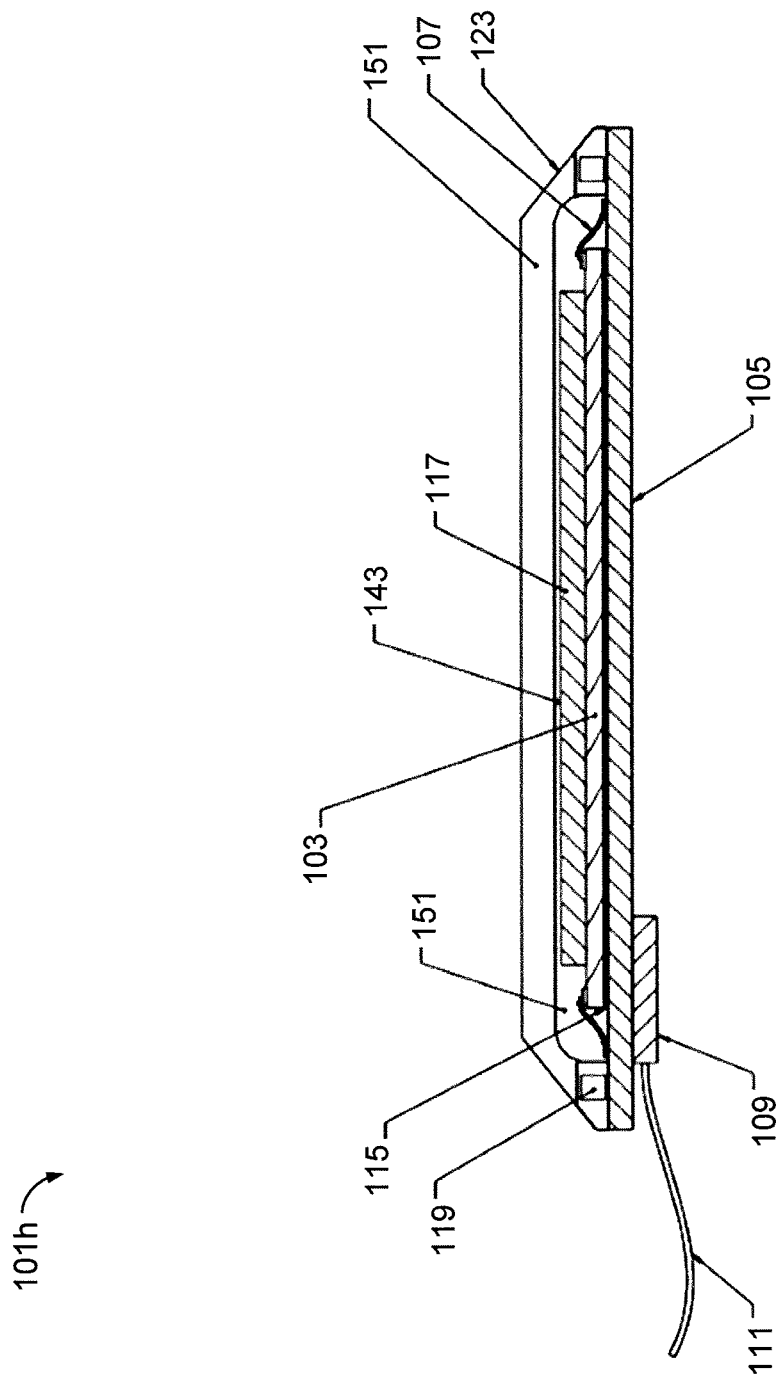
FIGS. 8A-8B depict an optical sensor package having a lid.
Figure 8B:
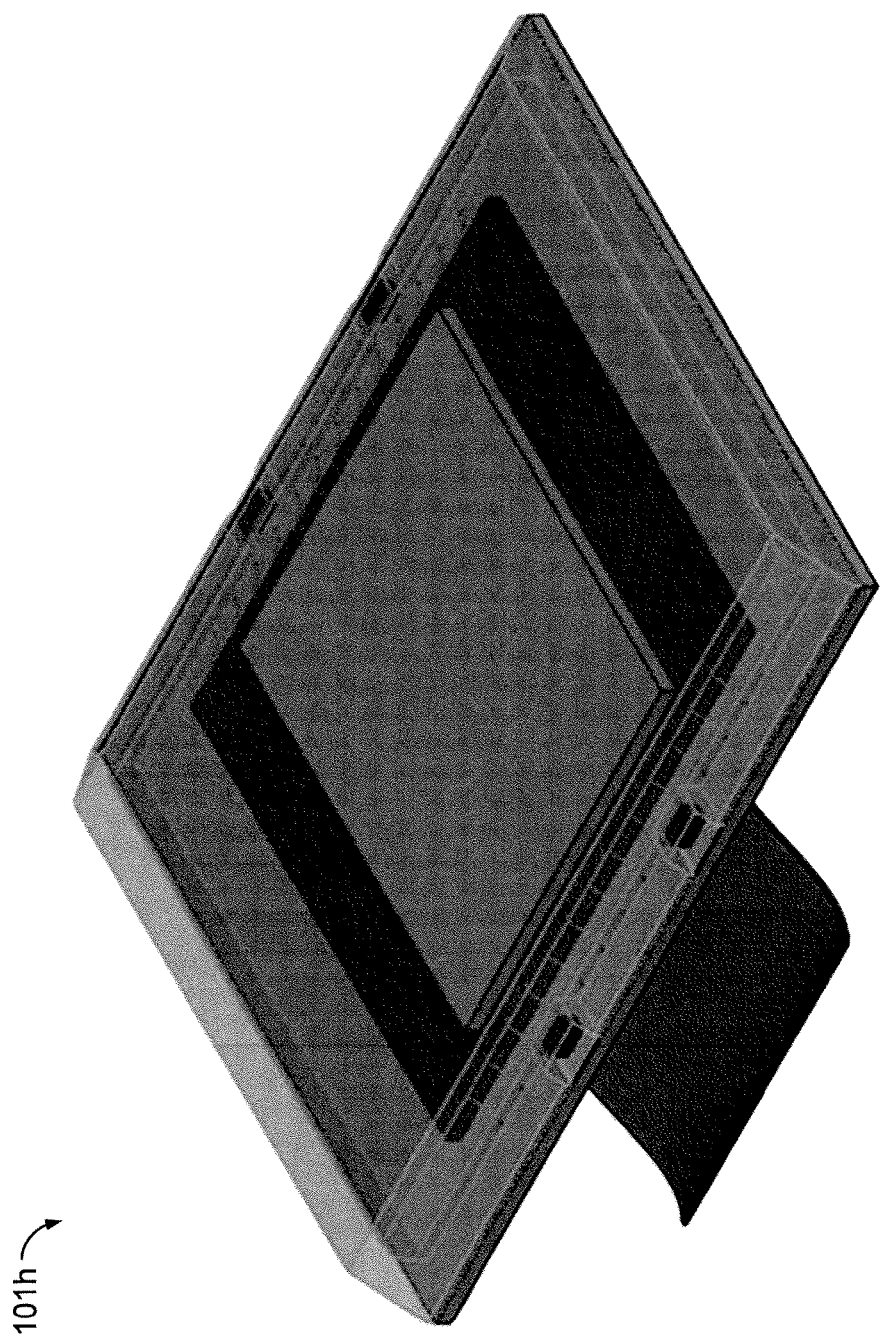
Figure 8C:
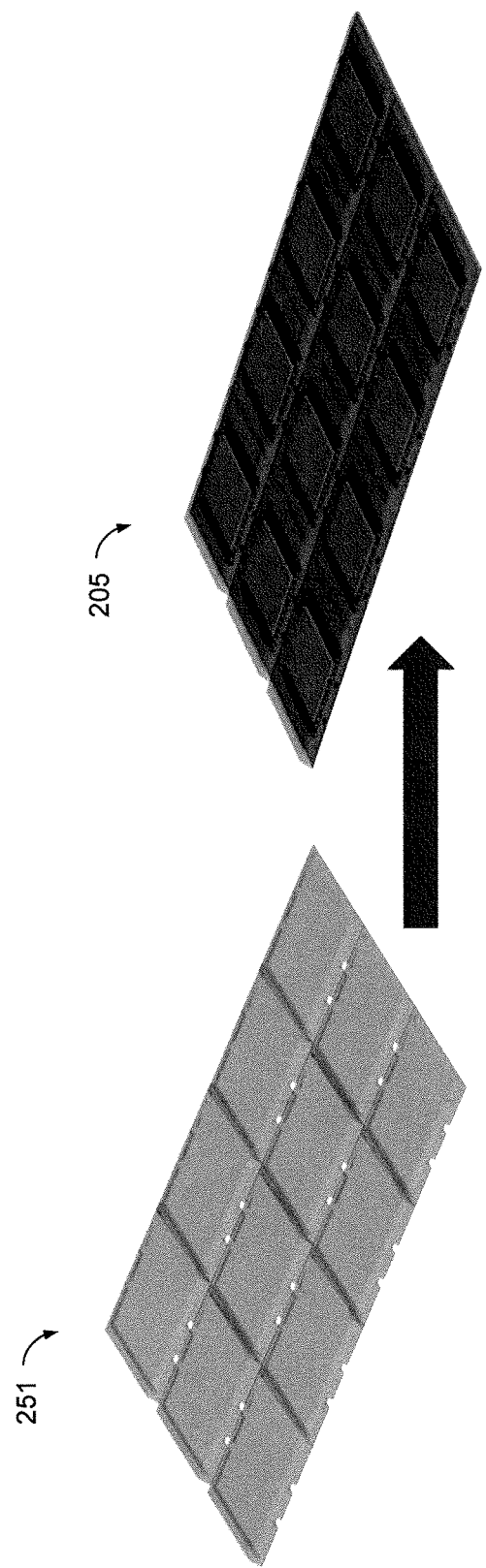
FIG. 8C depicts a lid array that can be attached to a substrate.

FIGS. 8A-8B depict another optical sensor package 101*h*. The optical sensor package 101*h* includes an optically clear lid 151 or cap positioned over the image sensor die 103. The lid 151 provides a protective cover and a light guide 122*a* over the image sensor die 103, with an air gap 143 below the light guide, between the light guide and the light filter layer 117. The lid 151 also provides an air cavity 153 around the image sensor die 103 and over the wire bonds 107. This construction protects the CMOS image sensor, any passives or other components, and wirebonds using "no contact," while still providing a light guide solution. The lid 151 can be made of an optically clear epoxy molding compound or other materials, and can be placed directly on top of pre-mounted LEDs. The lid 151 also includes reflective surface 123 over the LED light source 119. Coupling adhesives or fluids can be used to improve the light coupling between the pre-mounted LEDs and the clear lid or cap. Also, optical sensor package 101*h* can make use of pre-molded clear lids that can be applied to the substrate 105 in panel form, with the image sensor and other components already mounted in matrix (array) form. This is shown in FIG. 8C. The lid array 251 can be adhesively bonded to the substrate panel 205 and can be subsequently singulated using mechanical or other means. This format allows for low cost and ease of fabrication of the lid array and allows for a potentially favorable non-contact (i.e., no contact with CMOS image sensor) geometry. Also, the use of low modulus adhesives to attach the lid arrays to the substrate could be employed to provide a mechanical buffer between the typically high coefficient of thermal expansion (CTE) optically clear lid and the substrate, thus reducing stress and warpage in the final product.

Figure 9A:
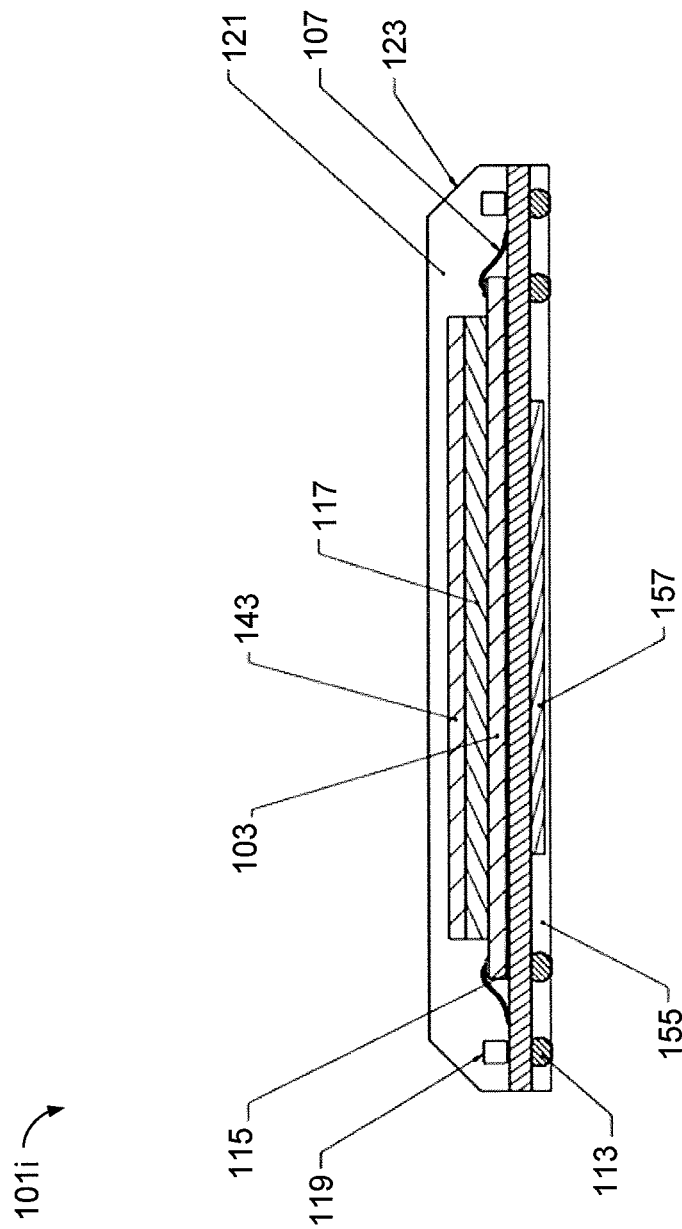
FIGS. 9A-9B depict an optical sensor package having an optically clear mold applied to opposing sides of a substrate.
Figure 9B:
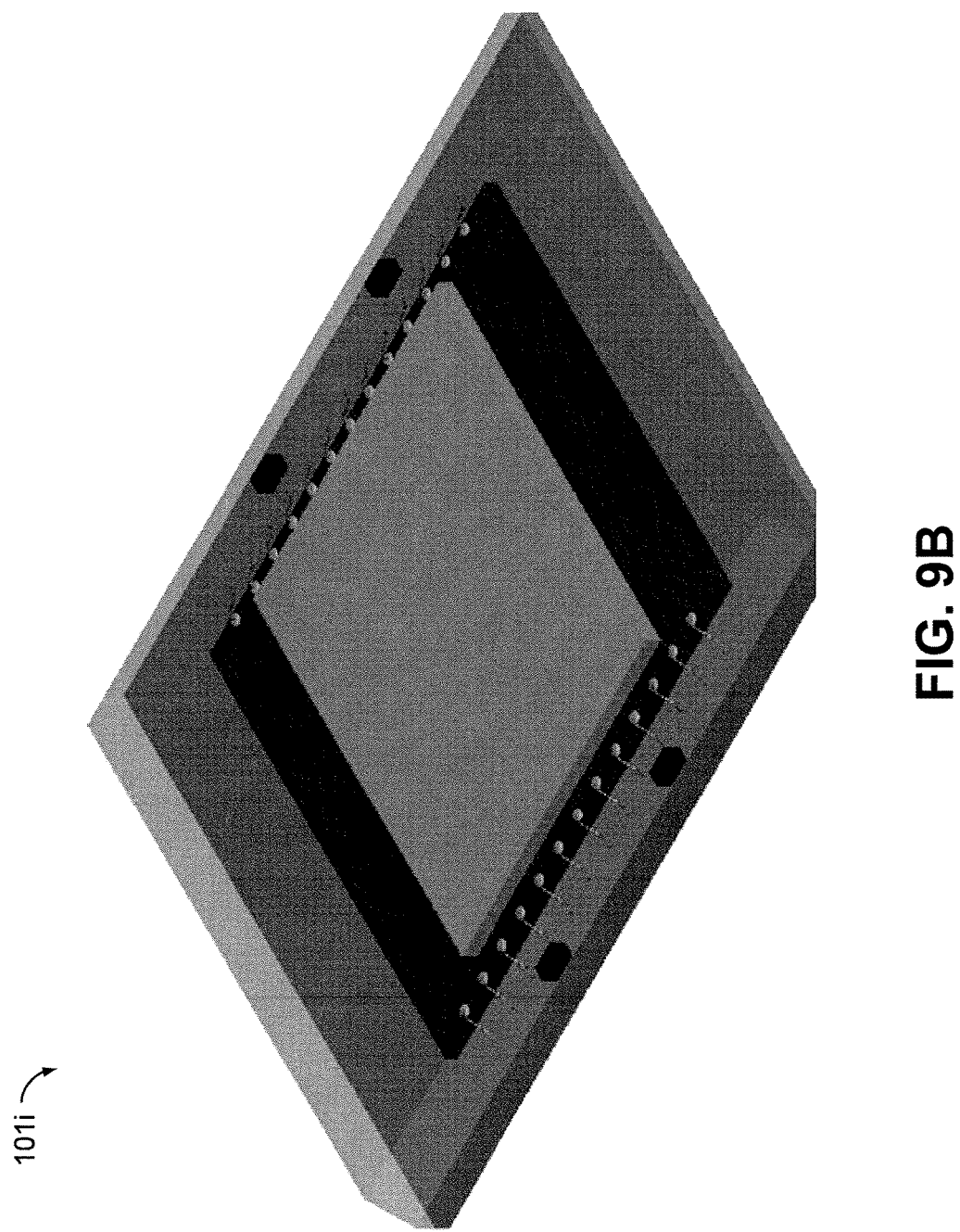

FIGS. 9A-9B depict another optical sensor package 101*i*. The optical sensor package 101*i* includes a second layer of molding compound 155 on the bottom side of the package. The second molding compound 155 can be applied to the bottom side of the substrate 105, encapsulating solder balls 113 that can then be polished down to reveal standard bond pad dimensions. Additionally, this allows for the inclusion of a bottom mounted components, such as control die 157, passive devices, and the like, which could result in a smaller form factor and more cost effective package. Typically OCEMC materials have relatively high coefficient of thermal expansions (CTEs) compared to other materials used in the construction of the package. The second layer of mold compound 155 can counteract unwanted effects (e.g., warpage, stress) of the high CTE materials that cure at higher temps as the cool down to room temp.

Figure 10A:
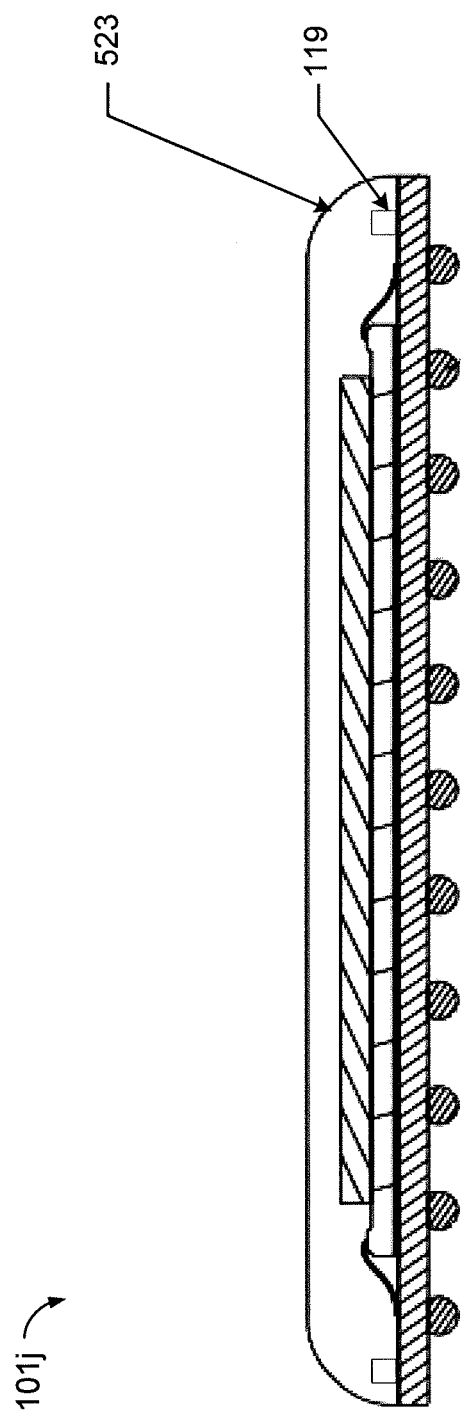
FIGS. 10A-10B depict an optical sensor package having a curved reflecting surface.
Figure 10B:
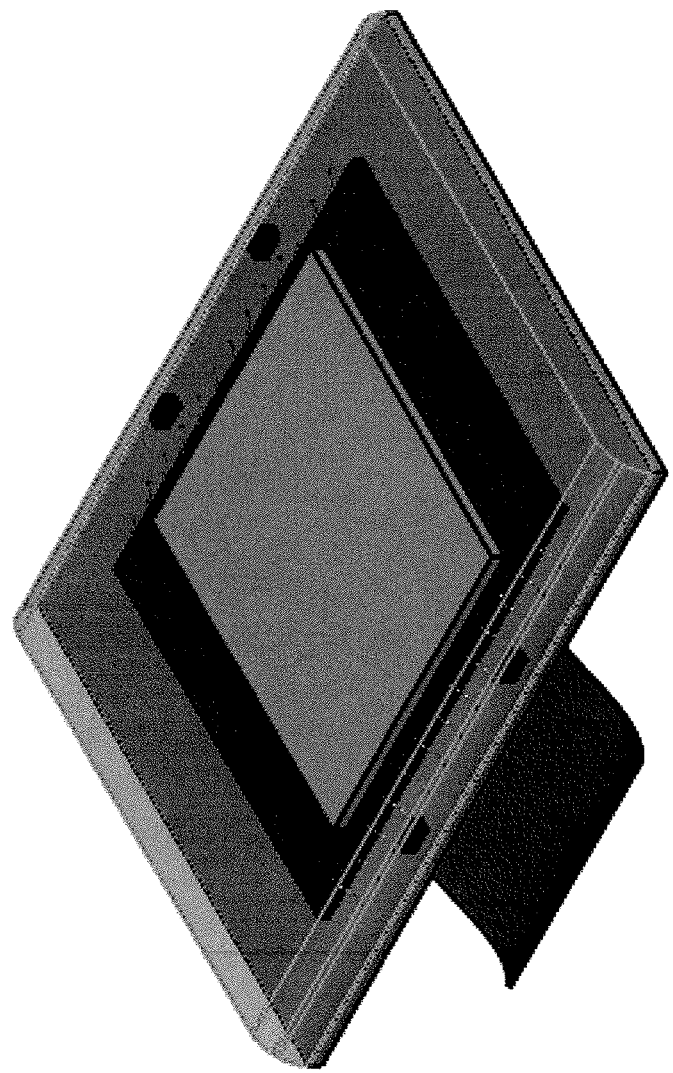

FIG. 10 depicts another optical sensor package 101j. The optical sensor package 101j includes a reflecting surface 523 having a curved surface configured to reflect light emitted by the LED light source 119 and direct this light to the sensing region. The reflecting surface is incorporated into an encapsulant or protective cover over the LEDs. The curved geometry may be used to further tune the illumination provided. The curved reflecting surface 523 may include a parabolic or elliptical shape, as two examples. The parabolic reflecting surface can be used with the LED light source 119 positioned at the focus of the parabola to provide a highly collimated beam of light reflected from the surface 523 into the light guide.

Figure 11:
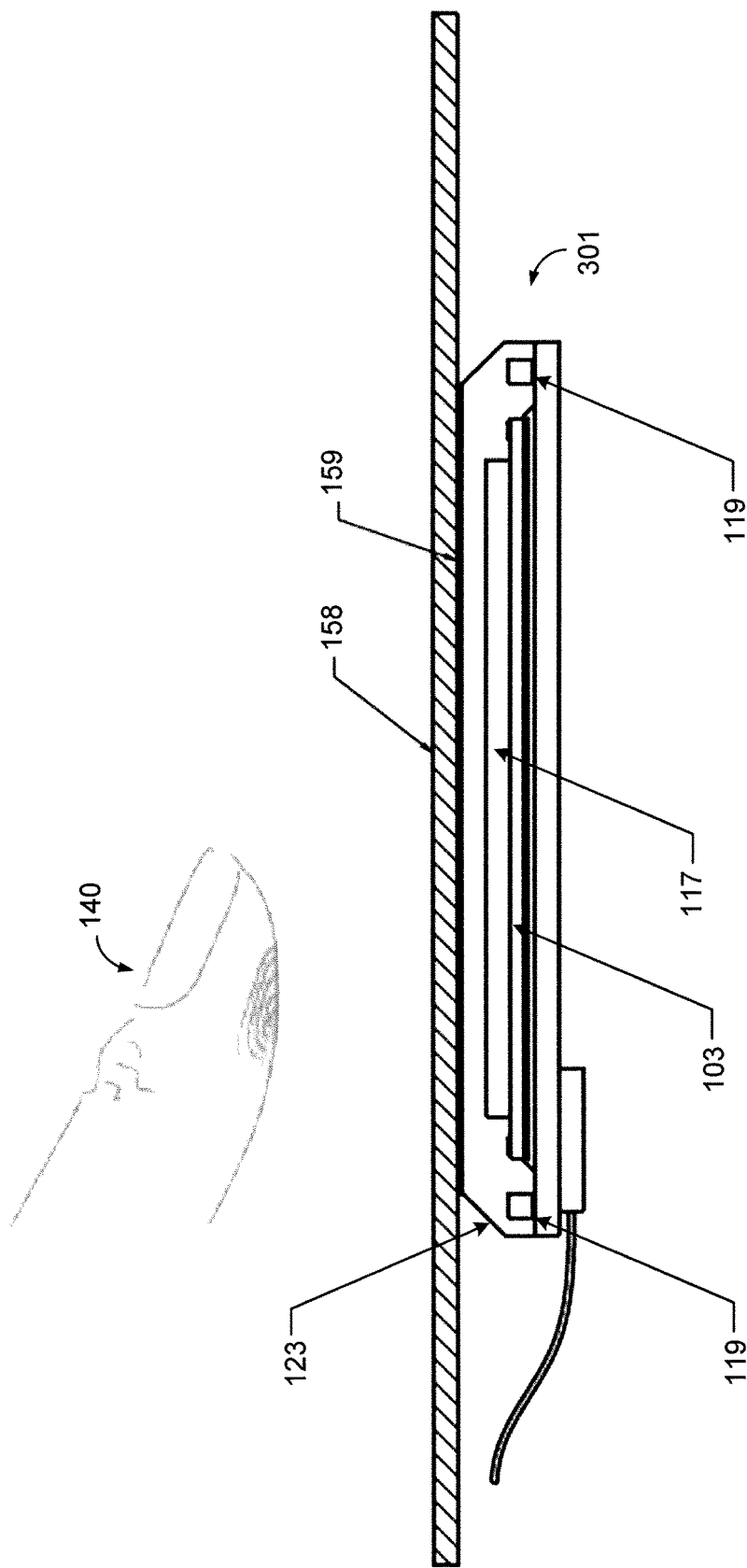
FIG. 11 depicts an optical sensor package mounted underneath a display cover glass.

FIG. 11 shows an example of an end use application of an optical fingerprint sensor package 301. In FIG. 11, the optical fingerprint sensor package 301 is placed under the cover glass 360 of a display, e.g., on a mobile device. The sensor package 301 is attached to an underside of the cover glass 158 using an optically clear adhesive (OCA) 159 allowing it to be optically coupled to the cover glass 158. Also, this CMOS image sensor-based fingerprint sensor package can also be mounted directly under a touchscreen, which can enable coupling of touch screen functions with the optical fingerprint sensor. The "under button" form factors are also compatible with this package design.

With reference to FIG. 11, the optical fingerprint sensor package 301 may be used to sense a fingerprint as follows. When a finger 140 is present over the sensor, the LED light sources 119 emit light upwards towards the reflecting surface 123 of the package. The reflecting surface 123 reflects all or a portion of this light towards the sensing region where it can be affected by the finger 140. In particular, if total internal reflection (TIR) mode illumination is used, the reflecting surface 123 reflects the light into a light guide positioned in a sensing area over the image sensor die 103. The light guide may be provided by the optical sensor package 301 itself, by the cover glass 158, or by a combination thereof. The light in the light guide is affected by the finger 140 in areas where the finger is in contact with an upper surface of the cover glass 158. For example, contact from the finger 140 may cause frustrated total internal reflection or scattering of the light in the light guide, and direct this light back down towards the image sensor die 103 below. This light then passes through the light filter layer 117 before reaching the photodetector elements of the image sensor die 103, where the light filter 117 layer acts on the light to provide a suitable fingerprint image capture by the image sensor die 103. A similar operating mode may be achieved with cover layers other than the cover glass 158 or with no cover layer at all, in which case an upper surface of the sensor package could provide a sensing surface for the finger. Also, other illumination modes, such as direct illumination or non-TIR illumination modes may be used, in which case the angle, shape, or positioning of the reflecting surface 123 may be adjusted accordingly to direct light to the appropriate area. If a non-TIR illumination mode is used, then a light guide need not be included in the package, or the light guide may be replaced or enhanced with other features, such as a scattering layer for extracting light.

Figure 12A:
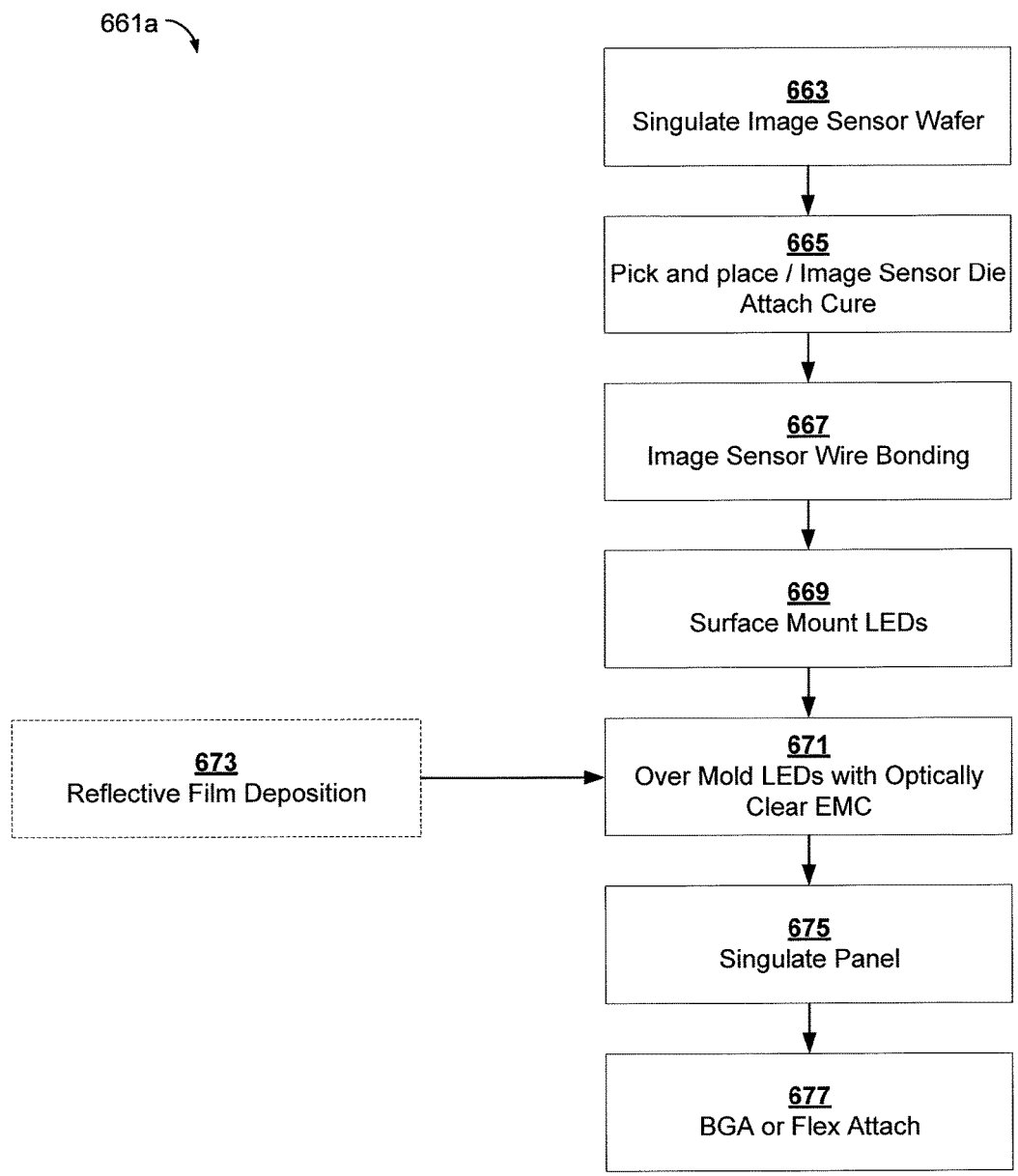
FIGS. 12A-12B depict methods of making optical sensor packages.
Figure 12B:
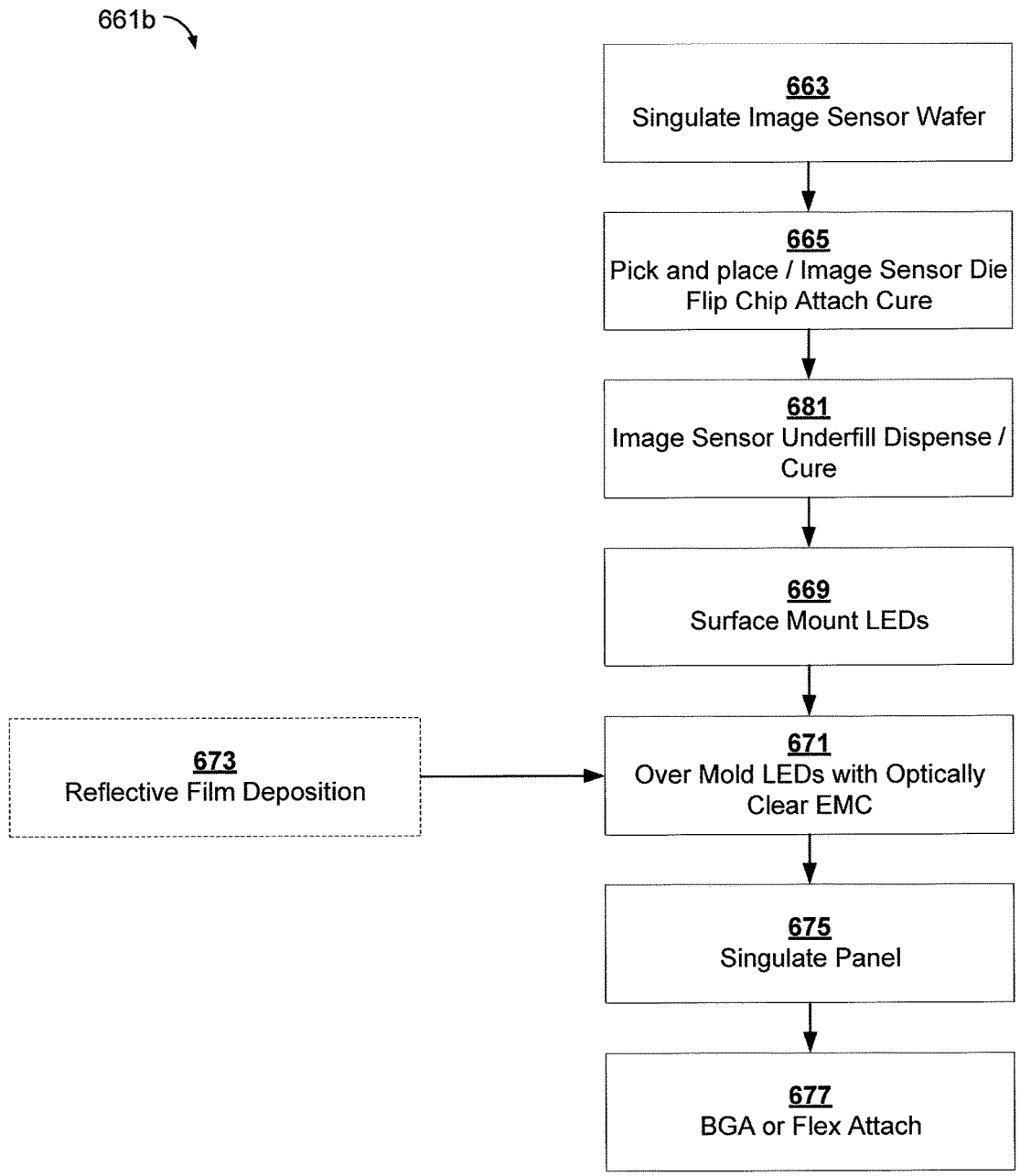

FIGS. 12A-12B depict two process flows for construction of optical sensor packages. FIG. 12A depicts a process flow 661a for construction of a wire bonded solution. Manufacturing of some of the individual components, such as the image sensor and light filter 117 layer are omitted for clarity. At step 663, an image sensor wafer is singulated or diced using a mechanical saw, laser, or other means. Optionally, the image sensor wafer is provided with a wafer level applied light filter and/or light guide layer. At step 665, the individual image sensor dies are attached to a substrate panel using a pick and place machine. At step 667, the image sensor dies are electrically connected to the substrate panel using wire bonding. At step 669, LEDs are surface mounted to the substrate panel, in areas neighboring the image sensor dies. At step 671, the LEDs are overmolded with an optically clear epoxy molding compound. The optically clear epoxy molding compound can be formed with a surface configured to reflect the light emitted from the LEDs. The optically clear molding compound may optionally be formed over all or a portion of the image sensor dies at this stage. At step 673, a reflective film is deposited over the outer surface of the optically clear epoxy mold compound, if desired. The reflective film can be formed with windows over the active sensing area of the image sensor dies at this stage. At step 675, the substrate panel with the image sensor dies and over molded LEDs attached thereto is singulated into a plurality of individual optical sensors. At step 677, BGA or flexible circuit is attached to the substrate and electrically connected thereto.

FIG. 12B depicts another process flow 661b for construction of a flip chip solution. At step 663, an image sensor wafer is singulated or diced using a mechanical saw, laser, or other means. Optionally, the image sensor wafer is provided with a wafer level applied light filter and/or light guide layer. At step 665, the individual image sensor dies are flip chip attached to a substrate panel using a pick and place machine. At step 681, underfill is dispensed and cured. At step 669, LEDs are surface mounted to the substrate panel, in areas neighboring the image sensor dies. At step 671, the LEDs are overmolded with an optically clear epoxy molding compound. The optically clear epoxy molding compound is formed with a surface configured to reflect the light emitted from the LEDs. The optically clear molding compound may optionally be formed over all or a portion of the image sensor dies at this stage. At step 673, a reflective film is deposited over the outer surface of the optically clear epoxy mold compound, if desired. The reflective film can be formed with windows over the active sensing area of the image sensor dies at this stage. At step 675, the substrate panel with the image sensor dies and over molded LEDs attached thereto is singulated into a plurality of individual optical sensors. At step 677, BGA or flexible circuit is attached to the substrate and electrically connected thereto.

Various embodiments described herein may address one or more of the following fundamental issues associated with the state of the art approach to creating an optical fingerprint sensor package:

(1) utilizing very mature molding processes and commercially available optically clear molding compounds to simultaneously protect the interconnects and/or active chip regions while also creating a functional light guide in a cost effective manner;

(2) making use of all currently available image sensor types (for example, lower cost front side illumination (F SI) type as well as back side illumination (BSI) type CMOS image sensors can be utilized);

(3) multiple die interconnect technologies can be employed in this packaging process (for example, standard or low profile wire bonding (e.g., as afforded by reverse bonding, to maximize top side clearance) can be used, and flip chip technology (multiple types) can also be employed to further reduce the form factor (size) of the package;

(4) in order to take advantage of flip chip interconnect processes, through silicon via technology (TSV) can be used to route the signals to the back side of the die to allow for the active side of the image sensor to face up with the interconnects on the opposite side, and by using CMOS image sensors with this interconnect technology, a smaller form factor device can be realized;

(5) a novel mold design coupled with optical modeling allows the use of molded in light guides (using OCEMC) to provide higher performance at lower cost;

(6) an embodiment can be achieved by using wafer level applied (can be laminated) optically clear illumination layer (s) formed directly on top of a wafer level applied collimator/or other light filter layer that may improve performance by reducing trapped open spaces and providing better light guiding performance;

(7) reflector structures can be strategically placed to enhance the light guide performance and can be overmolded using OCEMC;

(8) a wafer level applied (can be laminated) low index of refraction layer or a molded in air gap to improve the performance of the sensor;

(9) all package types can use matrix molded processing such that lower cost and higher volume can be achieved; and

(10) reflective films can be applied as needed post molding to fine tune the optical properties of the final package construction.

It will be appreciated that the various embodiments described above can be modified in various ways, and various features contained therein can be combined, modified, or removed in various ways without departing from the scope and spirit of this disclosure.

Thus, the embodiments and examples set forth herein were presented in order to best explain the present disclosure and its particular application and to thereby enable those skilled in the art to make and use the various embodiments. However, those skilled in the art will recognize that the foregoing description and examples have been presented for the purposes of illustration and example only. The description as set forth is not intended to be exhaustive or to limit the embodiments to the precise form disclosed. Those skilled in the art will also appreciate that various features from different embodiments and examples set forth herein may be combined, modified, and/or used together without departing from the scope of the present disclosure.

What is claimed is:

1. An optical sensor, comprising:
   a substrate;
   an image sensor disposed over the substrate, the image sensor being configured to optically capture an image from a sensing region over the image sensor;
   a light source disposed over the substrate;
   a light guide disposed over the image sensor and disposed between the sensing region and the image sensor;
   a light filter disposed over the image sensor and disposed between the light guide and the image sensor, wherein the light filter filters incident light so that rays of light that are within an acceptance angle are transmitted or allowed to pass through the light filter, while the light filter rejects or blocks rays of light that are outside of the acceptance angle; and
   an encapsulant disposed over the light source, wherein the encapsulant is coupled to the light guide and comprises a surface positioned to reflect light emitted from the light source and direct the reflected light into the light guide, wherein an air gap is molded in by the encapsulant, wherein the air gap is disposed over the light filter and disposed between the light guide and the light filter, and wherein a refractive index of the air gap is lower than a refractive index of the light guide.

2. The optical sensor of claim 1, wherein the substrate comprises a package substrate having electrical interconnections, wherein the image sensor is electrically connected to the package substrate, and wherein the light source is electrically connected to the package substrate.

3. The optical sensor of claim 1, wherein the image sensor comprises a photodetector array.

4. The optical sensor of claim 1, wherein the image sensor comprises a semiconductor die attached to the substrate.

5. The optical sensor of claim 1, wherein the image sensor is disposed over a first area of the substrate, and wherein the light source is disposed over a second area of the substrate outside of the first area of the substrate.

6. The optical sensor of claim 1, wherein the light source comprises a light-emitting diode (LED) attached to the substrate.

7. The optical sensor of claim 1, wherein the light source comprises a plurality of light-emitting diodes (LEDs) disposed over the substrate on opposing sides of the image sensor.

8. The optical sensor of claim 1, wherein the encapsulant comprises an optically clear molding compound.

9. The optical sensor of claim 1, wherein the encapsulant and the light guide are integrally formed, wherein the encapsulant and the light guide comprise an optically clear molding compound.

10. The optical sensor of claim 1, wherein the light filter comprises a collimator filter.

11. The optical sensor of claim 1, further comprising:
    a reflective layer disposed over the encapsulant.

12. The optical sensor of claim 11, wherein the reflective layer comprises a metallic coating over the surface positioned to reflect light, and wherein the metallic coating comprises a window in an area over the light guide and over an active area of the image sensor.

13. The optical sensor of claim 1, wherein the surface of the encapsulant is configured to reflect the light using Fresnel reflection.

14. The optical sensor of claim 1, wherein the surface of the encapsulant comprises a flat surface that is tilted relative to the light source.

15. The optical sensor of claim 1, wherein the surface of the encapsulant comprises a curved surface.

16. An optical fingerprint sensor package, comprising:
    a package substrate;
    an image sensor die disposed over the package substrate, wherein the image sensor die comprises a photodetector array and is electrically connected to the package substrate, the image sensor being configured to optically capture an image from a sensing region over the image sensor;
    a light guide disposed over the image sensor die and disposed between the sensing region and the image sensor;

a light filter disposed over the image sensor die and disposed between the light guide and the image sensor die, wherein the light filter filters incident light so that rays of light that are within an acceptance angle are transmitted or allowed to pass through the light filter, while the light filter rejects or blocks rays of light that are outside of the acceptance angle;

a light-emitting diode (LED) light source disposed over the package substrate;

an air gap disposed over the light filter between the light guide and the light filter, wherein a refractive index of the air gap is lower than a refractive index of the light guide; and an optically clear molding compound disposed over the LED light source, wherein the optically clear molding compound is coupled to the light guide and comprises a surface positioned to reflect light emitted from the light source and direct the reflected light into the light guide, wherein the air gap is molded in by the optically clear molding compound.

17. The optical fingerprint sensor package of claim 16, wherein the light filter comprises a collimator filter, wherein the collimator filter is configured to transmit a set of incident light rays within an acceptance angle from a normal to the collimator filter, and wherein the collimator filter is configured to reject a set of incident light rays outside of an acceptance angle from the normal to the collimator filter.

18. A method of forming an optical sensor package, the method comprising:

attaching an image sensor die to a substrate, the image sensor being configured to optically capture an image from a sensing region over the image sensor;

electrically connecting the image sensor die to the substrate;

mounting a light-emitting diode (LED) to the substrate; and overmolding the LED with an optically clear molding compound, wherein a light guide is disposed over the image sensor die and disposed between the sensing region and the image sensor die, and wherein a light filter disposed over the image sensor die and disposed between the light guide and the image sensor die, wherein the light filter filters incident light so that rays of light that are within an acceptance angle are transmitted or allowed to pass through the light filter, while the light filter rejects or blocks rays of light that are outside of the acceptance angle, wherein the optically clear molding compound comprises a surface positioned to reflect light emitted from the LED and direct the reflected light into the light guide, wherein an air gap is molded in by the optically clear molding compound, and wherein the air gap is disposed over the light filter and disposed between the light guide and the light filter, wherein a refractive index of the air gap is lower than a refractive index of the light guide.

19. The method of claim 18, wherein the image sensor die is electrically connected to the substrate by wire bonding the image sensor die to the substrate.

20. The method of claim 18, wherein the image sensor die is attached to the substrate and electrically connected to the substrate by flip chip attaching the image sensor die to the substrate.

21. The optical sensor of claim 1, wherein the sensing region comprises a sensing surface for receiving a finger, and wherein the sensing surface is disposed at an upper surface of the light guide.

22. The optical sensor of claim 1, wherein the light guide is coupled to a cover glass, and the sensing region comprises an upper surface of the cover glass.

* * * * *